(12) United States Patent
Han (10) Patent No.: US 7,855,441 B2
(45) Date of Patent: Dec. 21, 2010

(54) SEMICONDUCTOR CARD PACKAGE AND METHOD OF FORMING THE SAME

(75) Inventor: Chang-Hoon Han, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 272 days.

(21) Appl. No.: 11/938,643

(22) Filed: Nov. 12, 2007

(65) Prior Publication Data

US 2008/0173996 A1 Jul. 24, 2008

(30) Foreign Application Priority Data

Jan. 22, 2007 (KR) .................. 10-2007-0006624

(51) Int. Cl.
*H01L 23/02* (2006.01)
*H01L 23/28* (2006.01)
(52) U.S. Cl. .............. 257/678; 257/679; 257/787; 257/680
(58) Field of Classification Search ........... 257/678, 257/679, 680, 789, 787
See application file for complete search history.

(56) References Cited

U.S. PATENT DOCUMENTS

| 6,538,331 | B2 | 3/2003 | Masuda et al. | |
| 6,963,135 | B2 * | 11/2005 | Chiang et al. | 257/723 |
| 7,508,070 | B2 * | 3/2009 | Chiang | 257/723 |
| 2003/0155659 | A1 * | 8/2003 | Verma et al. | 257/777 |
| 2006/0108674 | A1 * | 5/2006 | Liou et al. | 257/679 |

FOREIGN PATENT DOCUMENTS

| JP | 9-1972 | 1/1997 |
| JP | 2001-217383 | 8/2001 |
| JP | 2007-005443 | 1/2007 |
| KR | 2001-0081699 | 8/2001 |
| KR | 10-2004-0014185 | 2/2004 |
| KR | 10-2004-0037268 | 5/2004 |

OTHER PUBLICATIONS

English language abstract of Japanese Publication No. 9-1972.
English language abstract of Japanese Publication No. 2001-217383.
English language abstract of Korean Publication No. 2001-0081699.
JEDEC Standard No. JESD84-A41, "Embedded MultiMediaCard (eMMC) Product Standard, Standard Capacity," Jun. 2007, JEDEC Solid State Technology Association, Arlington, VA.

* cited by examiner

*Primary Examiner*—Chuong A. Luu
(74) *Attorney, Agent, or Firm*—Volentine & Whitt, PLLC (57) ABSTRACT

A semiconductor card package and a method of manufacturing the semiconductor cared package are provided. The package may include a housing having a cavity. The cavity may have a size corresponding to at least one standard semiconductor package. External terminals may be exposed on the outside of the housing. Internal terminals may be disposed in the cavity. At least one internal semiconductor package may be inserted into the cavity. The internal semiconductor package includes I/O terminals. Each of the I/O terminals is connected to a corresponding one of the internal terminals.

21 Claims, 7 Drawing Sheets

SEMICONDUCTOR CARD PACKAGE AND METHOD OF FORMING THE SAME

CROSS-REFERENCE TO RELATED APPLICATION

This application claims the benefit of Korean Patent Application No. 10-2007-0006624, filed Jan. 22, 2007, the disclosure of which is hereby incorporated by reference.

BACKGROUND

1. Field of the Invention

The present invention relates to a semiconductor device, and more particularly, to a semiconductor card package and a method of forming the same.

2. Description of the Related Art

As electronic devices, such as portable moving picture players, digital cameras, etc. become increasingly lightweight, thin, compact, and multifunctional, various auxiliary storage devices such as memory cards have become widely used. In general, the memory cards have a controller chip and non-volatile memory chips.

However, the memory cards need various types of packages to correspond to different designs of the electronic devices. For example, the memory cards available in the market are configured to meet various specifications including those of multi-media cards (MMCs), reduced size multi-media cards (RSMMCs), and micro-multi-media cards (MMC micros).

Figure 1:
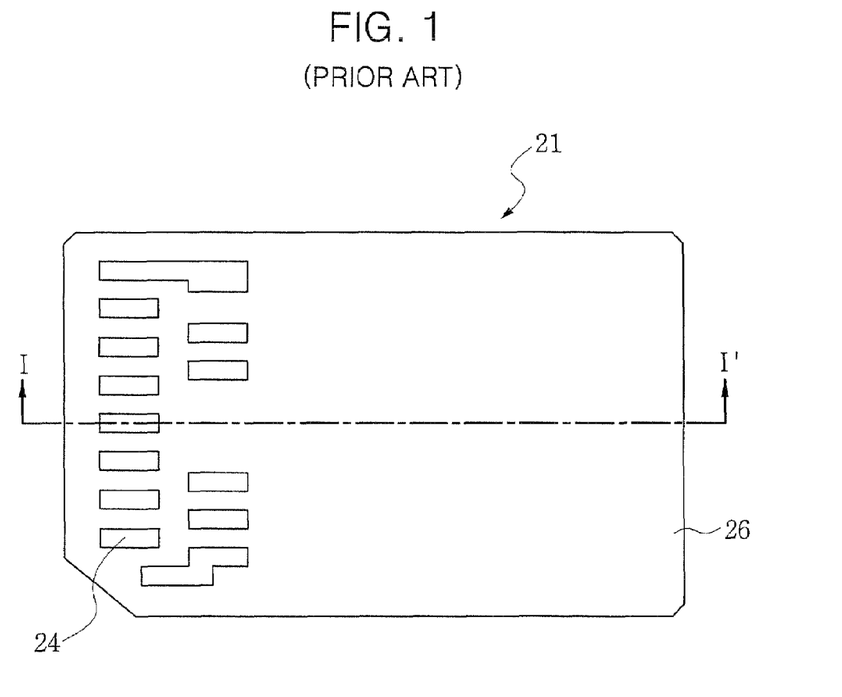
FIG. 1 is a plan view of a conventional multi-media card (MMC).
Figure 2:
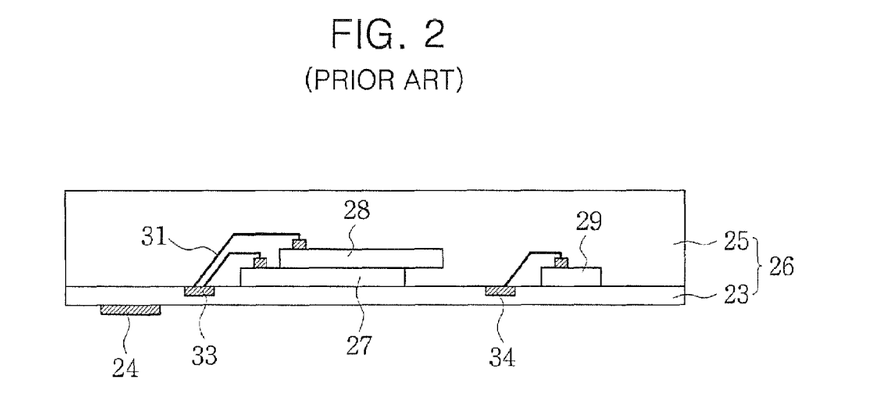
FIG. 2 is cross-sectional view taken along line I-I' of FIG. 1, which illustrates the conventional MMC.

FIG. 1 is a plan view of a conventional multi-media card (MMC), and FIG. 2 is a cross-sectional view taken along line I-I' of FIG. 1.

Referring to FIGS. 1 and 2, a conventional MMC 21 includes a housing 26 composed of a printed circuit board 23 and a main body 25.

Bond fingers 33 and 34 are disposed on one side of the printed circuit board 23, and external terminals 24 are disposed on the other side of the printed circuit board 23. First and second memory chips 27 and 28 are stacked on the printed circuit board 23. Also, a controller chip 29 is disposed adjacent to the memory chips 27 and 28 on the printed circuit board 23. The controller chip 29 and the memory chips 27 and 28 are electrically connected to the corresponding bond fingers 34 and 33 by bonding wires 31, respectively.

The main body 25 covers the printed circuit board 23, the controller chip 29, and the memory chips 27 and 28. The main body 25 is usually formed of a thermosetting resin.

Figure 3:
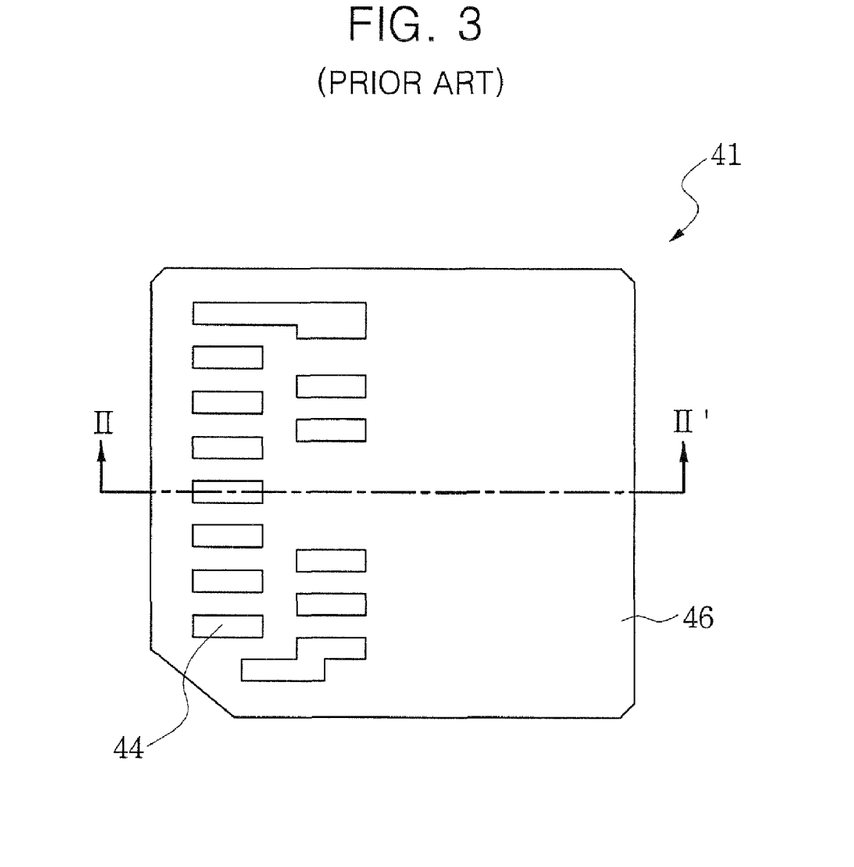
FIG. 3 is a plan view of a conventional reduced size multi-media card (RSMMC).
Figure 4:
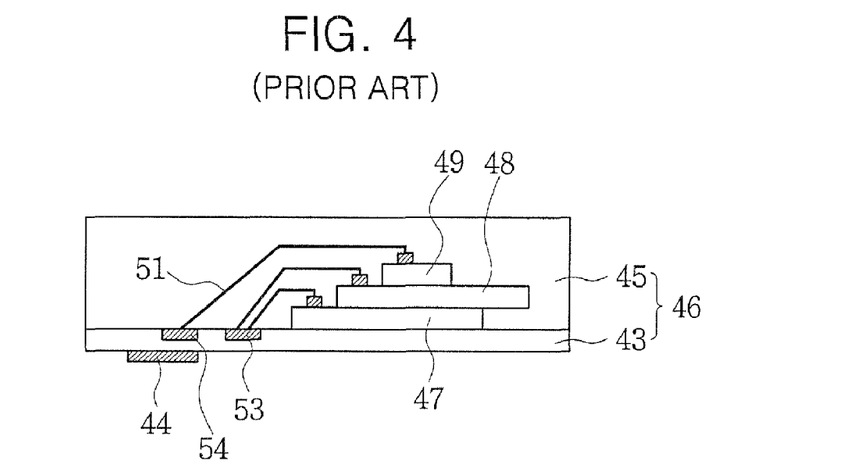
FIG. 4 is a cross-sectional view taken along line II-II' of FIG. 3, which illustrates the conventional RSMMC.

FIG. 3 is a plan view of a conventional reduced size multi-media card (RSMMC), and FIG. 4 is a cross-sectional view taken along line II-II' of FIG. 3.

Referring to FIGS. 3 and 4, a conventional RSMMC 41 includes a housing 46 composed of a printed circuit board 43 and a main body 45. The housing 46 of the RSMMC 41 is smaller than the housing 26 of the MMC 21.

Bonding fingers 53 and 54 are disposed on one side of the printed circuit board 43, and external terminals 44 are disposed on the other side of the printed circuit board 43. First and second memory chips 47 and 48 are stacked on the printed circuit board 43. Also, a controller chip 49 is disposed on the second memory chip 48. The controller chip 49 and the memory chips 47 and 48 are electrically connected to the corresponding bond fingers 54 and 53 by bonding wires 51, respectively.

The main body 45 covers the printed circuit board 43, the controller chip 49, and the memory chips 47 and 48. The main body 45 is usually formed of a thermosetting resin.

However, to implement packages having different sizes, for example, the MMC 21 and the RSMMC 41 illustrated in FIGS. 1 to 4, different manufacturing processes and equipment are required. These processes and equipment reduce production efficiency and raise production cost.

Different types of memory cards having a plurality of memory chips are disclosed in U.S. Pat. No. 6,538,331 B2 entitled "Semiconductor Device and Method of Manufacturing the Same" by Masuda, et al.

SUMMARY

Embodiments of the present invention provide a semiconductor card package that can implement packages having different specifications in the same manufacturing process. Other embodiments of the present invention provide methods of forming the above semiconductor card package.

In one embodiment a semiconductor card package includes a housing having a cavity. The cavity may have a size corresponding to at least one standard semiconductor package. External terminals are formed to be exposed to the outside of the housing. Internal terminals are disposed in the cavity. At least one internal semiconductor package is inserted into the cavity. The internal semiconductor package includes I/O terminals. Each of the I/O terminals is connected to a corresponding one of the internal terminals.

BRIEF DESCRIPTION OF THE DRAWINGS

The foregoing and other objects, features and advantages of the invention will become more apparent from the following detailed description of exemplary embodiments of the invention and the accompanying drawings. The drawings are not necessarily to scale, emphasis instead being placed upon illustrating the principles of the invention.

DETAILED DESCRIPTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on another layer or on a substrate, that layer may be formed on the other layer or on the substrate, or a third layer may be interposed between the layer and the other layer or substrate. Like numbers designate like elements throughout the drawings.

Figure 5:
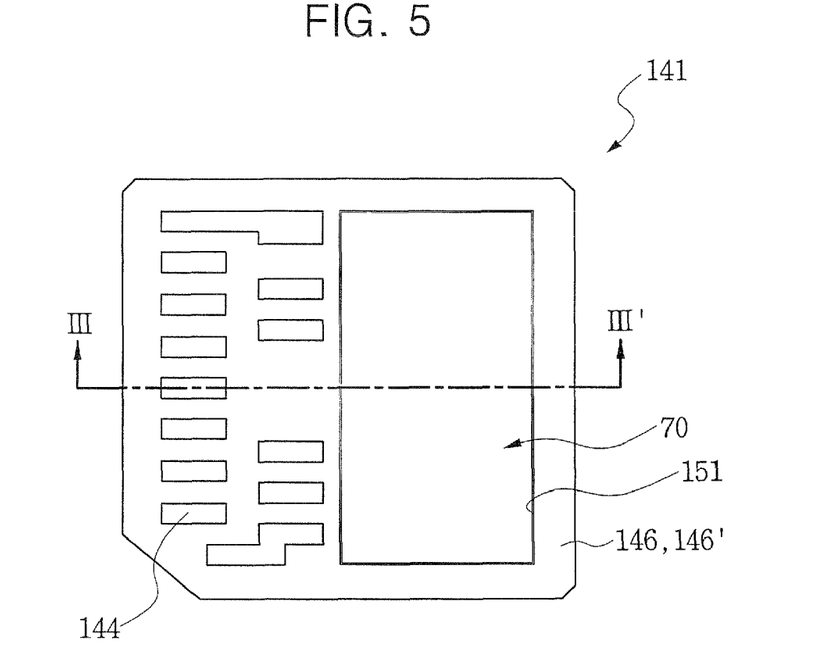
FIG. 5 is a plan view of a reduced size multi-media card (RSMMC) according to first and second exemplary embodiments of the present invention.
Figure 6:
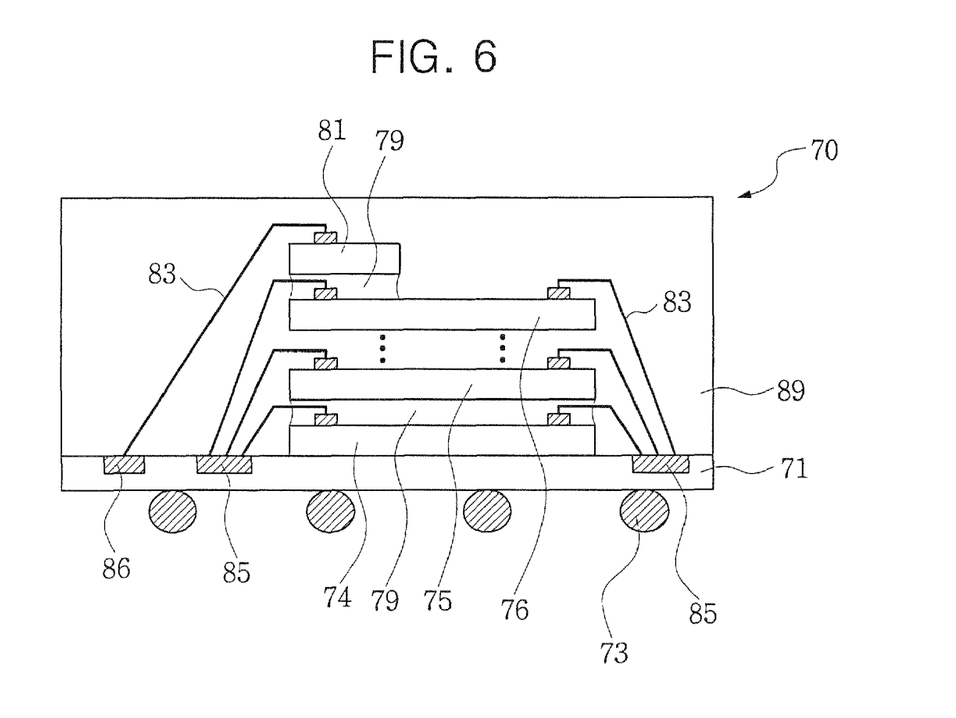
FIG. 6 is a cross-sectional view of a MoviNAND suitable for exemplary embodiments of the present invention.
Figure 7:
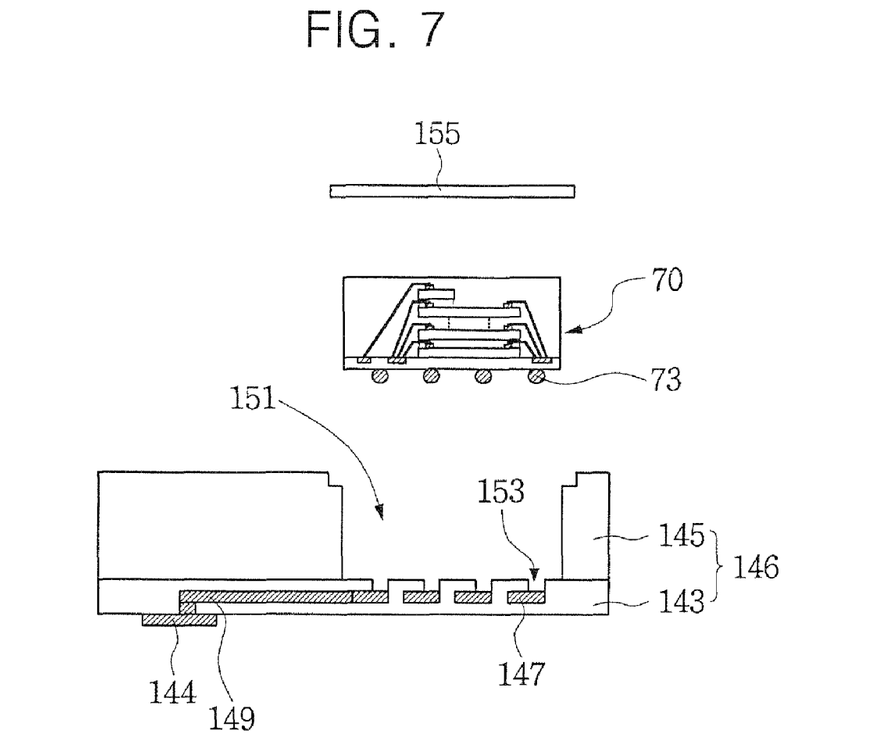
FIGS. 7 and 9 are exploded cross-sectional views taken along line III-III' of FIG. 5.
Figure 8:
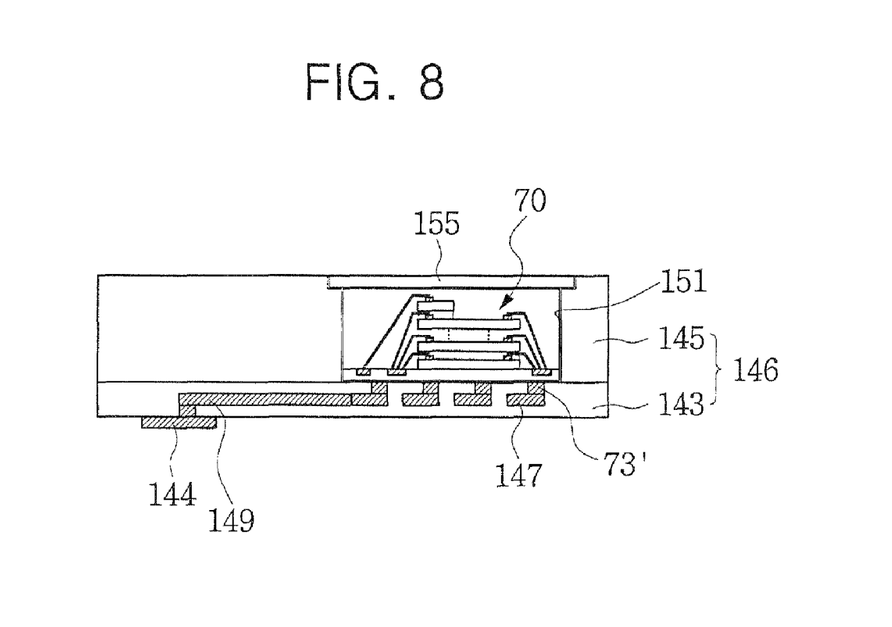
FIGS. 8 and 10 are cross-sectional views taken along line III-III' of FIG. 5.
Figure 9:
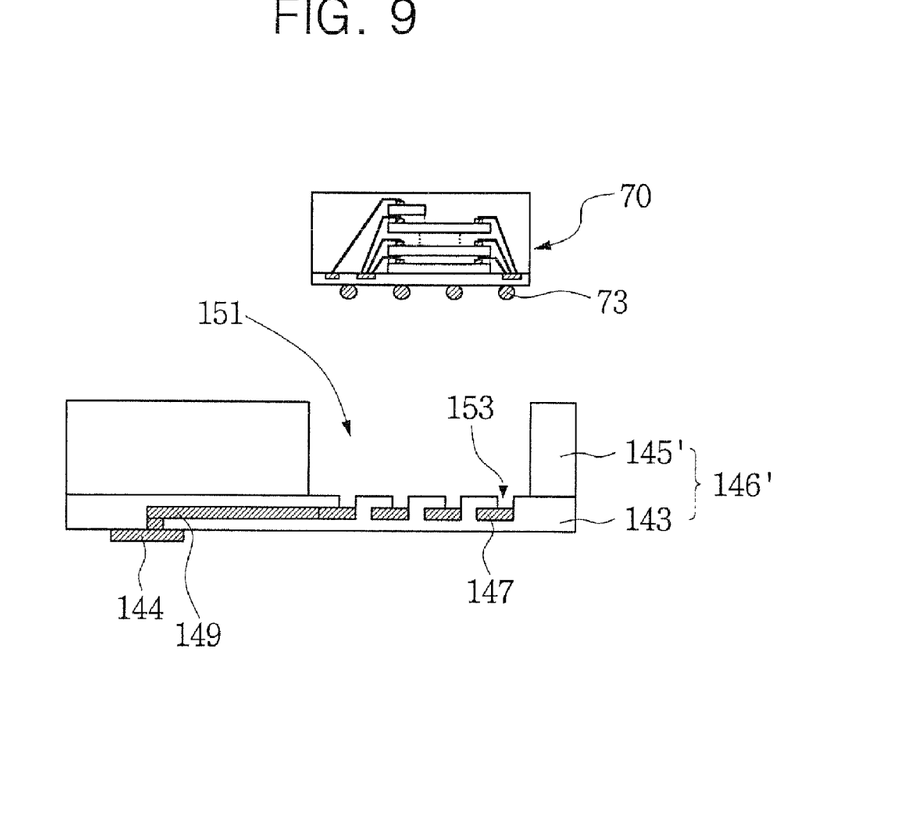
Figure 10:
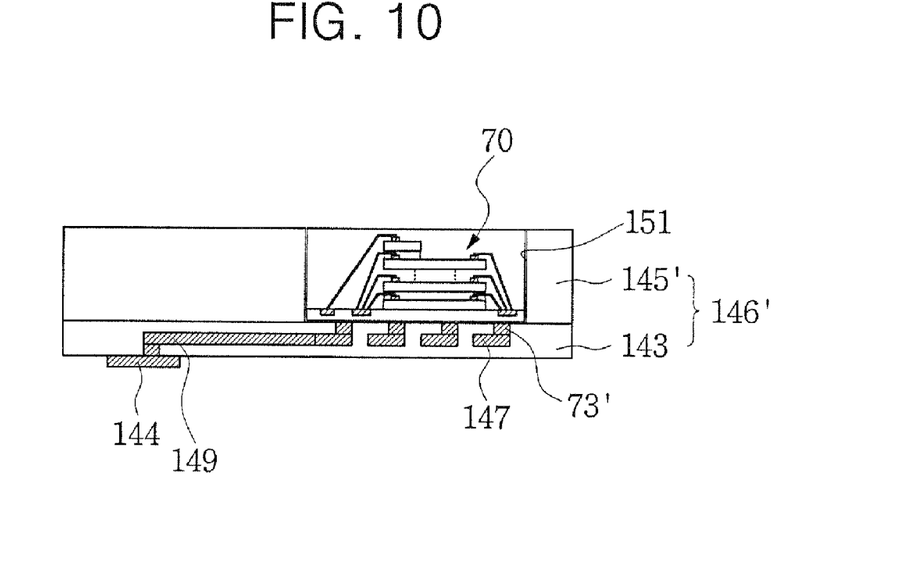

FIG. 5 is a plan view of a reduced size multi-media card (RSMMC) according to first and second exemplary embodiments of the present invention, and FIG. 6 is a cross-sectional view of a MoviNAND suitable for exemplary embodiments of the present invention. FIGS. 7 and 9 are exploded cross-sectional views taken along line III-III' of FIG. 5, and FIGS. 8 and 10 are cross-sectional views taken along line III-III' of FIG. 5.

Referring to FIG. 5, a reduced size multi-media card (RSMMC) 141 according to first and second exemplary embodiments of the present invention may include housings 146 and 146' having a cavity 151, and a MoviNAND 70 inserted into the cavity 151. The housings 146 and 146' may include external terminals 144. The external terminals 144 may be disposed on an outside surface of the housings 146 and 146'.

Although not illustrated in the drawing, various kinds of internal semiconductor packages may be inserted into the cavity 151. The internal semiconductor package may be a standard semiconductor package or a customized semiconductor package. For example, the standard semiconductor package may be a ball grid array (BGA) package. In this embodiment, the internal semiconductor package may be the MoviNAND 70. The internal semiconductor package may include at least one nonvolatile memory chip. The nonvolatile memory chip may be a NAND flash memory chip. Further, the internal semiconductor package may further include a controller chip.

The case where the MoviNAND 70 is inserted into the cavity 151 of the RSMMC 141 will now be described.

Referring to FIG. 6, the MoviNAND 70 suitable for exemplary embodiments of the present invention may include first to third flash memory chips 74, 75, and 76 and a controller chip 81.

The NAND flash memory chips 74, 75, and 76 may be sequentially stacked on a substrate 71. The substrate 71 may be a printed circuit board or a flexible PCB. Input/output (I/O) terminals 73 may be disposed on a first side of the substrate 71, such as on the bottom surface of the substrate 71. The I/O terminals 73 may include a conductive ball. For example, the conductive ball may be a solder ball or a gold bump. Also, the I/O terminals 73 may be arranged at regular intervals according to the specification of the standard semiconductor package.

Bond fingers 85 and 86 may be disposed on a second side of the substrate 71, such as on the top surface of the substrate 71. Each bond finger 85 or 86 may be electrically connected to a corresponding I/O terminal by an interconnection (not illustrated) built in the substrate 71. The bond fingers 85 and 86 may include a conductive layer, for example, formed of copper (Cu).

The NAND flash memory chips 74, 75, and 76 may be sequentially stacked adjacent to the bond fingers 85 and 86 on the substrate 71. Although not shown, additional NAND flash memory chips may be stacked between the second NAND flash memory chip 75 and the third NAND flash memory chip 76. The controller chip 81 may be disposed on the third NAND flash memory chip 76.

The NAND flash memory chips 74, 75, and 76 and the controller chip 81 may be fixed by an adhesive material layer 79. For example, the adhesive material layer 79 may be interposed between the first and second NAND flash memory chips 74 and 75. Additionally, the adhesive material layer 79 may be interposed between the controller chip 81 and the third NAND flash memory chip 76. The adhesive material 79 may also be formed between adjacent memory chips stacked between the second memory chip 75 and the third memory chip 76. The adhesive material layer 79 may be formed of a thermosetting resin.

The NAND flash memory chips 74, 75, and 76 and the controller chip 81 may be electrically connected to the bond fingers 86 and 85 by bonding wires 83. That is, one end of the bonding wire 83 may be in contact with at least one of the bond fingers 85 and 86, and the other end of the bonding wire 83 may be in contact with a corresponding one of the NAND flash memory chips 74, 75, and 76 and the controller chip 81. Additionally, the bonding wires 83 may be formed through the adhesive material layer 79 to be connected to bond pads formed on the upper surfaces of the memory chips 74, 75, and 76 and the controller chip 81. The bonding wires 83 may be an Au wire, an Al wire, or a conductive tape.

The NAND flash memory chips 74, 75, and 76, the controller chip 81 and the bonding wires 83 may be covered by a protection member 89. The protection member 89 may be formed of thermosetting resin, engineering plastic, or ceramic.

The MoviNAND 70 may be called a "MoviNAND" or a "MoviNAND package."

Referring to FIGS. 5, 6, 7, and 8, the RSMMC 141 according to the first exemplary embodiment may include a housing 146 having a cavity 151, and a MoviNAND 70 inserted into the cavity 151.

The housing 146 may include a printed circuit board 143 and a main body 145 covering the printed circuit board 143. Internal terminals 147 may be disposed on a first side of the printed circuit board 143, such as on a top surface of the printed circuit board 143. External terminals 144 may be disposed on a second side of the printed circuit board 143, such as on the bottom surface of the printed circuit board 143. Each external terminal 144 may be connected to one of the internal terminals 147 via an interconnection 149 buried in the printed circuit board 143. That is, each external terminal 144 may be electrically connected to a corresponding one of the internal terminals 147. The external terminals 144, the internal terminals 147, and the interconnections 149 may include a conductive layer, for example, formed of Cu.

The cavity 151 may be provided in the main body 145. The main body 145 may be formed of thermosetting resin, engineering plastic, or ceramic. The external terminals 144 may be exposed to the outside of the main body 145.

The internal terminals 147 may be exposed in the cavity 151. A surface of the printed circuit board 143 between the internal terminals 147 may protrude from surfaces of the internal terminals 147. Also, edges of the internal terminals 147 may be buried in the printed circuit board 143. In this case, the printed circuit board 143 may include one or more openings 153 exposing the internal terminals 147.

The cavity 151 may have a size corresponding to the standard semiconductor package. The standard semiconductor package may be a BGA package.

The MoviNAND 70, as described with reference to FIG. 6, may include I/O terminals 73. The I/O terminals 73 may include a conductive ball. Also, the I/O terminals 73 may be arranged at regular intervals according to the specification of a standard semiconductor package. As a result, the I/O terminals 73 of the MoviNAND 70 may be arranged so that they correspond with both the openings 153 and the internal terminals 147, respectively, to be electrically connected to the internal terminals 147 of the RSMMC 141. That is, each of the I/O terminals 73 may be in contact with a corresponding internal terminal 147.

Further, the I/O terminals 73 may be bonded to the internal terminals 147 by a reflow process. The bonded I/O terminals 73' may exhibit excellent electrical conductivity and mechanical strength.

A cover 155 may be provided to cover the cavity 151. In this case, the cover 155 may cover the MoviNAND 70. The cover 155 may be formed of the same material as the main body 145. Alternatively, the cover 155 may be formed of a material having excellent heat radiation characteristics and high mechanical strength like a metal plate.

Referring to FIGS. 5, 6, 9, and 10, the RSMMC 141 according the second exemplary embodiment of the present invention may have the same components as the first exemplary embodiment except for the cover 155. Thus, only differences from the first exemplary embodiment will be described below.

The RSMMC 141 according to the second exemplary embodiment of the present invention may include a housing 146' having a cavity 151 and a MoviNAND 70 inserted into the cavity 151. The housing 146' may include a printed circuit board 143 and a main body 145' covering the printed circuit board 143.

The MoviNAND 70, as described with reference to FIG. 6, may include input/output (I/O) terminals 73. The I/O terminals 73 may include a conductive ball. The I/O terminals 73 may be bonded to internal terminals 147 by a reflow process, respectively. The bonded I/O terminals 73' may exhibit excellent conductivity and mechanical strength. As this embodiment of the present invention does not include a cover (such as 155 in FIGS. 7 and 8), the MoviNAND 70 may be exposed to the outside of the main body 145'. This orientation may help improve heat radiation of the MoviNAND 70.

Figure 11:
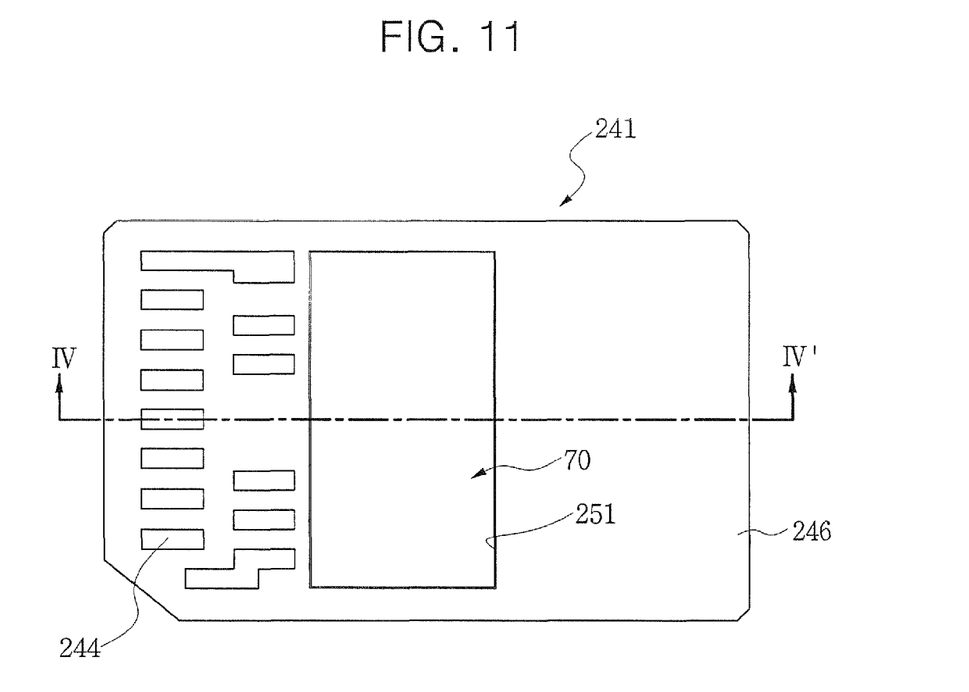
FIG. 11 is a plan view of a multi-media card (MMC) according to a third exemplary embodiment of the present invention.
Figure 12:
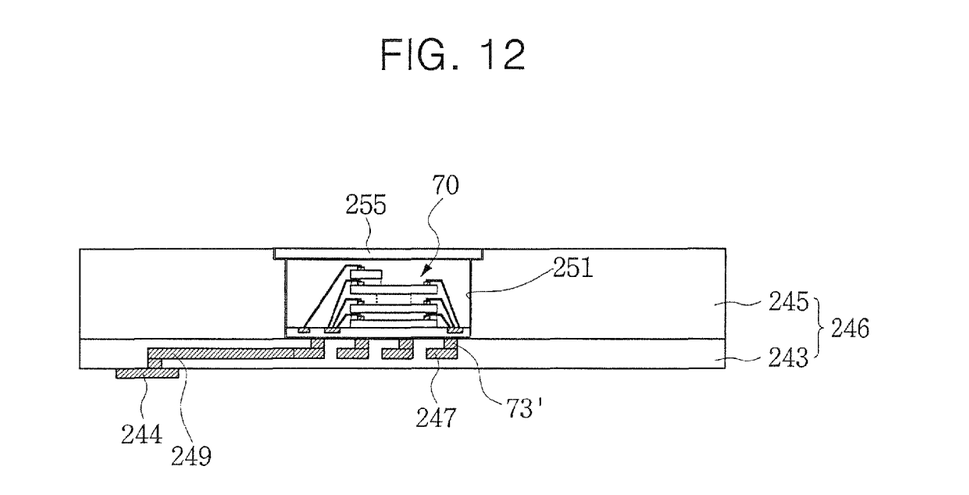
FIG. 12 is a cross-sectional view taken along line IV-IV' of FIG. 11.

FIG. 11 is a plan view of a multi-media card (MMC) according to a third exemplary embodiment of the present invention, and FIG. 12 is a cross-sectional view taken along line IV-IV' of FIG. 11.

Referring to FIGS. 11 and 12, an MMC 241 according to the third exemplary embodiment of the present invention may include internal semiconductor packages including a housing 246 having a cavity 251 and a MoviNAND 70 inserted into the cavity 251. The housing 246 may include external terminals 244. The external terminals 244 may be disposed on an outside surface of the housing 246.

The MMC 241 according to the third exemplary embodiment of the present invention may have a structure with a relatively larger length than the RSMMC 141 of the first exemplary embodiment. Thus, only the differences from the first exemplary embodiment will now be described.

The housing 246 may include a printed circuit board 243 and a main body 245 covering the printed circuit board 243. Internal terminals 247 may be disposed on a first side of the printed circuit board 243, such as on a top surface of the printed circuit board 243. External terminals 244 may be disposed on a second side of the printed circuit board 243, such as on a bottom surface of the printed circuit board 243. Each external terminal 244 may be connected to a corresponding one of the internal terminals 247 via an interconnection 249 buried in the printed circuit board 243.

As illustrated in the drawings, the housing 246 shown in FIGS. 11 and 12 may have a structure with a relatively larger length than that of the RSMMC 141 shown in FIGS. 5 to 10.

The cavity 251 may be provided in the main body 245. The external terminals 244 may be exposed to the outside of the main body 245. The MoviNAND 70, as described with reference to FIG. 6, may include I/O terminals 73. The I/O terminals 73 may include a conductive ball. Also, the I/O terminals 73 may be arranged at regular intervals according to the specification of a standard semiconductor package.

The I/O terminals 73 may be bonded to the internal terminals 247 by a reflow process, respectively. The bonded I/O terminals 73, may exhibit excellent electrical conductivity and mechanical strength. Each bonded I/O terminal 73' may be connected to a corresponding internal terminal 247. A surface of the printed circuit board 243 between the internal terminals 247 may protrude from surfaces of the internal terminals 247. Also, edges of the internal terminals 247 may be buried in the printed circuit board 243.

A cover 255 may be provided to cover the cavity 251. The cover 255 may be formed of the same material as the main body 245. Alternatively, the cover 255 may be formed of a material with excellent heat radiation characteristics and high mechanical strength like a metal plate. However, the cover 255 may be omitted.

Figure 13:
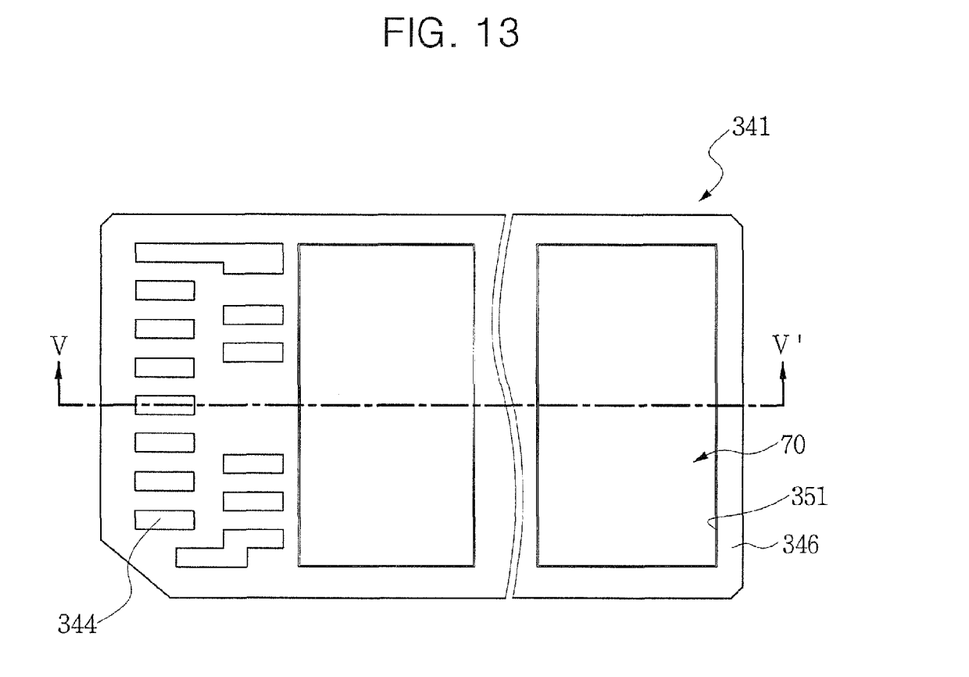
FIG. 13 is a plan view of a multi-media card (MMC) according to a fourth exemplary embodiment of the present invention.
Figure 14:
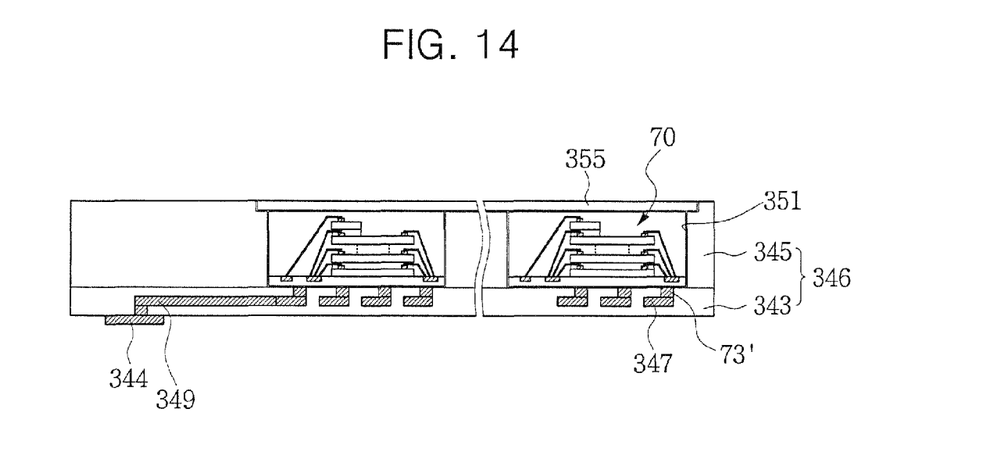
FIG. 14 is a cross-sectional view taken along line V-V' of FIG. 13.

FIG. 13 is a plan view of a multi-media card (MMC) according to a fourth exemplary embodiment of the present invention, and FIG. 14 is a cross-sectional view taken along line V-V' of FIG. 13.

Referring to FIGS. 13 and 14, an MMC 341 according to the fourth exemplary embodiment of the present invention may include a housing 346 having one or more cavities 351 and a plurality of MoviNANDs 70 inserted into the one or more cavities 351. The housing 346 may include external terminals 344. The external terminals 344 may be disposed on an outside surface of the housing 346.

The housing 346 may include a printed circuit board 343 and a main body 345 covering the printed circuit board 343. Internal terminals 347 may be disposed on a first side of the printed circuit board 343, such as a top surface of the printed circuit board 343. The external terminals 344 may be disposed on a second side of the printed circuit board 343, such as a bottom surface of the printed circuit board 343. Each external terminal 344 may be connected to a corresponding one of the internal terminals 347 via an interconnection 349 buried in the printed circuit board 343.

The one or more cavities 351 may be provided in the main body 345. The one or more cavities 351 may have a size corresponding to one or more standard semiconductor packages. The standard semiconductor package may be a BGA package. For example, the main body 345 may include a single cavity 351 that corresponds to a plurality of semiconductor packages. Alternately, the main body 345 may include a plurality of cavities 351, where each cavity 351 corresponds to a single semiconductor package. The external terminals 344 may be exposed to the outside of the main body 345.

The MoviNAND 70, as illustrated with reference to FIG. 6, may include I/O terminals 73. The I/O terminals 73 may include a conductive ball. Also, the I/O terminals 73 may be arranged at regular intervals according to the specification of a standard semiconductor package.

The I/O terminals 73 may be bonded to the internal terminals 347 by a reflow process, respectively. The bonded I/O terminals 73' may exhibit excellent electrical conductivity and mechanical strength. Each bonded I/O terminal 73' may be connected to a corresponding one of the internal terminals 347. A surface of the printed circuit board 343 between the internal terminals 347 may protrude from surfaces of the internal terminals 347. Also, edges of the internal terminals 347 may be buried in the printed circuit board 343.

One or more covers 355 may be provided to cover the one or more cavities 351. The one or more covers 355 may cover the MoviNANDs 70. The one or more covers 355 may be formed of the same material as the main body 345. Alternatively, the one or more covers 355 may be formed of a material with excellent heat radiation characteristics and high mechanical strength like a metal plate. However, the covers 355 may be omitted.

Methods of forming a semiconductor card package according to the first to fourth exemplary embodiments of the present invention will now be described with reference to FIGS. 5 to 14.

Referring again to FIGS. 5 to 8, a method of forming the RSMMC 141 according to the first exemplary embodiment of the present invention may include preparing a housing 146 having a cavity 151. The housing 146 may be composed of a printed circuit board 143 and a main body 145 covering the printed circuit board 143.

Internal terminals 147 may be formed in a first side of the printed circuit board 143, such as in a top surface of the printed circuit board 143. External terminals 144 may be formed on a second side of the printed circuit board 143, such as on a bottom surface of the printed circuit board 143. Each external terminal 144 may be formed to be electrically connected to a corresponding one of the internal terminals 147 via an interconnection 149 buried in the printed circuit board 143. That is, each external terminal 144 may be formed to be electrically connected to a corresponding one of the internal terminals 147. The external terminals 144, the internal terminals 147, and the interconnections 149 may be formed of a conductive layer such as a Cu layer.

A surface of the printed circuit board 143 between the internal terminals 147 may be formed to protrude from surfaces of the internal terminals 147. Also, edges of the internal terminals 147 may be formed to be buried in the printed circuit board 143. In this case, an opening 153 exposing the internal terminal 147 may be formed in the printed circuit board 143.

The cavity 151 may be formed in the main body 145. The main body 145 may be formed of thermosetting resin, engineering plastic, or ceramic. The external terminals 144 may be exposed to the outside of the main body 145. The internal terminals 147 may be formed in a cavity region and exposed from the substrate 143.

The cavity 151 may be formed to have a size corresponding to a standard semiconductor package. The standard semiconductor package may be a BGA package.

Then, an internal semiconductor package, such as the MoviNAND 70 described with reference to FIG. 6, may be provided. The MoviNAND 70 may be formed to have I/O terminals 73. The I/O terminals 73 may be formed to have a conductive ball. Also, the I/O terminals 73 may be formed at regular intervals according to the specification of a standard semiconductor package. The conductive ball may be a solder ball or a gold bump.

The MoviNAND 70 may be inserted into the cavity 151.

As a result, the I/O terminals 73 may be arranged in the internal terminals 147 through the openings 153, respectively. That is, each I/O terminal 73 may be connected to a corresponding one of the internal terminals 147.

Subsequently, the I/O terminals 73 may be bonded to the internal terminals 147 by a reflow process, respectively. The bonded I/O terminals 73' may exhibit excellent electrical conductivity and mechanical strength. The reflow process may be performed at a temperature where the conductive ball can be at least partially melted.

However, the reflow process may be omitted.

Further, a cover 155 may be formed to cover the cavity 151. The cover 155 may be formed of the same material as the main body 145. Alternatively, the cover 155 may be formed of a material with excellent heat radiation characteristics and high mechanical strength like a metal plate. The cover 155 may cover the MoviNAND 70. Also, the cover 155 may be formed before the reflow process.

Referring again to FIGS. 5, 6, 9, and 10, a method of forming the RSMMC 141 according to the second exemplary embodiment of the present invention may include preparing a housing 146' having a cavity 151. The housing 146' may be composed of a printed circuit board 143 and a main body 145' covering the printed circuit board 143.

As described with reference to FIG. 6, an internal semiconductor package such as a MoviNAND 70 may be provided. The MoviNAND 70 may be formed to have I/O terminals 73. The I/O terminals 73 may be formed to have a conductive ball. Also, the I/O terminals 73 may be formed at regular intervals according to the specification of a standard semiconductor package. The conductive ball may be a solder ball or a gold bump.

The MoviNAND 70 may be inserted into the cavity 151.

Subsequently, the I/O terminals 73 may be bonded to the internal terminals 147 by a reflow process, respectively. The bonded I/O terminals 73' may exhibit excellent electrical conductivity and mechanical strength. The reflow process may be performed at a temperature where the conductive ball can be at least partially melted.

As described above, the method of forming the RSMMC 141 according to the second exemplary embodiment of the present invention may omit the step of forming the cover 155 from the method of the first exemplary embodiment. In this case, a top of the MoviNAND 70 may be formed to be exposed to the outside of the main body 145'.

Referring again to FIGS. 11 and 12, a method of forming the MMC 241 according to the third exemplary embodiment may include preparing a housing 246 having a cavity 251. The housing 246 may be composed of a printed circuit board 243 and a main body 245 covering the printed circuit board 243.

The MMC 241 according to the third exemplary embodiment of the present invention may be formed relatively larger in length than the RSMMC 141 of the first exemplary embodiment. So, only the differences from the first exemplary embodiment will now be described.

Internal terminals 247 may be formed in a first side of the printed circuit board 243, such as in a top surface of the printed circuit board 243. External terminals 244 may be formed on a second side of the printed circuit board 243, such as on a bottom surface of the printed circuit board 243. Each external terminal 244 may be connected to a corresponding one of the internal terminals 247 via an interconnection 249 buried in the printed circuit board 243.

A substrate of the printed circuit board 243 between the internal terminals 247 may be formed to protrude from surfaces of the internal terminals 247. Also, edges of the internal terminals 247 may be formed to be buried in the printed circuit board 243.

The cavity 251 may be formed in the main body 245. The main body 245 may be formed of thermosetting resin, engineering plastic, or ceramic. The external terminals 244 may be exposed to the outside of the main body 245. The internal terminals 247 may be formed to be exposed in the cavity 251.

The cavity 251 may be formed to have a size corresponding to a standard semiconductor package. The standard semiconductor package may be a BGA package.

Then, an internal semiconductor package, such as the MoviNAND 70 illustrated with reference to FIG. 6, may be provided. The MoviNAND 70 may be formed to have I/O terminals 73. The I/O terminals 73 may be formed to have a conductive ball. Also, the I/O terminals 73 may be formed at regular intervals according to the specification of the standard semiconductor package. The conductive ball may be a solder ball or a gold bump.

The MoviNAND 70 may be inserted into the cavity 251.

As a result, the I/O terminals 73 may be arranged to electrically connect with the internal terminals 247, respectively. That is, each I/O terminal 73 may be in contact with a corresponding one of the internal terminals 247.

Subsequently, the I/O terminals 73 may be bonded to the internal terminal 247 by a reflow process. The bonded I/O terminals 73' may have excellent electrical conductivity and mechanical strength. The reflow process may be performed at a temperature where the conductive ball may be at least partially melted.

However, the reflow process may be omitted.

Further, a cover 255 may be formed to cover the cavity 251. The cover 255 may be formed of the same material as the main body 245. Alternatively, the cover 255 may be formed of a material with excellent heat radiation characteristics and high mechanical strength like a metal plate. The cover 255 may cover the MoviNAND 70. Also, the cover 255 may be formed before the reflow process. However, the process of forming the cover 255 may be omitted.

Referring again to FIGS. 13 and 14, a method of forming the MMC 341 according to the fourth exemplary embodiment of the present invention may include preparing a housing 236 having one or more cavities 351. The housing 346 may be composed of a printed circuit board 343 and a main body 345 covering the printed circuit board 343.

Internal terminals 347 may be formed in a first side of the printed circuit board 343, such as in the top surface of the printed circuit board 343. External terminals 344 may be formed on a second side of the printed circuit board 343, such as on the bottom surface of the printed circuit board 343. The external terminals 344 may be connected to corresponding one of the internal terminals 347 via an interconnection 349 buried in the printed circuit board 343, respectively.

A surface of the printed circuit board 343 between the internal terminals 347 may be formed to protrude from surfaces of the internal terminals 347. Also, edges of the internal terminals 347 may be formed to be buried in the printed circuit board 343.

The one or more cavities 351 may be formed in the main body 345. The main body 345 may be formed of thermosetting resin, engineering plastic, or ceramic. The external terminals 344 may be formed to be exposed to the outside of the main body 345. The internal terminals 347 may be exposed in the one or more cavities 351.

The one or more cavities 351 may be formed to have a size corresponding to one or more standard semiconductor packages, as previously described. The standard semiconductor package may be a BGA package.

Then, as illustrated with reference to FIG. 6, internal semiconductor packages such as a plurality of MoviNANDs 70 may be provided. The MoviNAND 70 may be formed to have I/O terminals 73. Also, the I/O terminals 73 may be formed to have a conductive ball. The I/O terminals 73 may be formed at regular intervals according to the specification of a standard semiconductor package. The conductive ball may be a solder ball or a gold bump.

The plurality of MoviNANDs 70 may be inserted into the one or more cavities 351.

As a result, the I/O terminals 73 may be arranged to electrically connect with the internal terminals 347, respectively. That is, each I/O terminal 73 may be in contact with a corresponding one of the internal terminals 347.

The I/O terminals 73 may be bonded to the internal terminals 347 by a reflow process, respectively. The bonded I/O terminals 73' may exhibit excellent electrical conductivity and mechanical strength. The reflow process may be performed at a temperature where the conductive ball may be at least partially melted.

However, the reflow process may be omitted.

Further, one or more covers 355 may be formed to cover the one or more cavities 351. The one or more covers 355 may be formed of the same material as the main body 345. Alternatively, the one or more covers 355 may be formed of a material with excellent heat radiation characteristics and high mechanical strength like a metal plate. The one or more covers 355 may cover the MoviNANDs 70. Also, the one or more covers 355 may be formed before the reflow process. However, the process of forming the covers 355 may be omitted.

According to the exemplary embodiments of the present invention described with reference to FIGS. 5 to 14, semiconductor card packages 141, 241, and 341 including housings 146, 146', 246, and 346 having cavities 151, 251, and 351 and internal semiconductor packages inserted into the cavities 151, 251, and 351 may be provided. The internal semiconductor package may be a MoviNAND 70. The MoviNAND 70 may include a controller chip 81 and several NAND flash memory chips 74, 75, and 76.

Here, the housings 146, 146', 246, and 346 may have various specifications such as those for a multi-media card (MMC), a reduced size multi-media card (RSMMC), and a micro-multi-media card (MMC micro). However, the cavities 151, 251, and 351 may have a size corresponding to a standard semiconductor package. Accordingly, even if the housings 146, 146', 246, and 346 have different sizes, the semiconductor card packages 141, 241 and 341 may be formed using many of the same manufacturing process. Additionally, standard MoviNANDs 70 or other semiconductor packages can be used with each semiconductor card package 141, 241, and 341 to further reduce costs and streamline manufacturing processes.

According to the present invention as described above, a semiconductor card package including a housing having a cavity and an internal semiconductor package inserted into the cavity may be provided. The internal semiconductor package may be a MoviNAND. The MoviNAND may include a controller chip and several NAND flash memory chips. The cavity may have a size corresponding to the standard semiconductor package. Accordingly, even if the housings have different sizes, the semiconductor card package may be formed in the same manufacturing process. That is, it is possible to realize the semiconductor card package having high productivity and low production cost.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor card package, comprising:
a housing including external terminals exposed at the exterior of the card package, a cavity, and internal terminals revealed by the cavity and connected to the external terminals; and
at least one internal semiconductor package disposed in the cavity and having a substrate, input/output (I/O) terminals disposed on the substrate, each of the I/O terminals being connected to one of the internal terminals of the housing, and at least one chip mounted to the substrate, the at least one chip being electrically connected to the I/O terminals,
wherein the housing comprises:
a printed circuit board (PCB) comprising a substrate and the internal and external terminals, wherein the internal terminals are integral with the substrate of the PCB and are revealed at one side of the PCB, and the external terminals are integral with the substrate of the PCB and are revealed at the other side of the PCB; and
a main body disposed on said one side of the PCB and having an opening constituting the cavity, and
wherein the substrate of the PCB of the housing has one or more openings in a surface thereof, the internal terminals being recessed below the surface and revealed by the one or more openings.

2. The semiconductor card package according to claim 1, wherein the internal semiconductor package is a standard semiconductor package occupying substantially the entirety of the cavity.

3. The semiconductor card package according to claim 2, wherein the I/O terminals of the internal semiconductor package comprise an array of conductive members.

4. The semiconductor card package according to claim 1, wherein the at least one chip of the internal semiconductor package comprises at least one non-volatile memory chip.

5. The semiconductor card package according to claim 4, wherein the non-volatile memory chip is a NAND flash memory chip.

6. The semiconductor card package according to claim 4, wherein the at least one chip of the internal semiconductor package further comprises a controller chip.

7. The semiconductor card package according to claim 6, wherein the controller chip overlies the non-volatile memory chip.

8. The semiconductor card package according to claim 1, wherein the at least one chip of the internal semiconductor package is a MoviNAND, which comprises a controller chip and at least one NAND flash memory chip.

9. The semiconductor card package according to claim 1, further comprising a cover covering the cavity.

10. The semiconductor card package according to claim 9, wherein the cover includes a metal plate to radiate heat from the internal semiconductor package.

11. A housing for a card package, comprising:
a printed circuit board (PCB) including a substrate, and internal terminals and external terminals integral with the substrate; and
a main body body disposed on one side of the PCB and having an opening constituting a cavity in the housing, and
wherein the substrate of the PCB of the housing has one or more openings in a surface thereof, the internal terminals being recessed below the surface and revealed by the one or more openings,
the external terminals are revealed at the other side of the PCB and are exposed at the exterior of the housing, and the external terminals are electrically connected to the internal terminals.

12. The housing according to claim 11, wherein the cavity has a size corresponding to at least one standard semiconductor package.

13. The housing according to claim 12, wherein the standard semiconductor package is a ball grid array (BGA) package.

14. The housing according to claim 12, wherein the cavity has a size corresponding to at least two standard semiconductor packages.

15. The housing according to claim 11, wherein the main body has at least two spaced apart openings constituting at least two cavities in the housing, respectively, wherein each cavity has a size corresponding to a standard semiconductor package.

16. The housing according to claim 11, further comprising a cover covering the cavity.

17. A semiconductor card package, comprising:
a printed circuit board including:
a substrate having a first surface and a second surface opposite the first surface,
internal terminals having a top surface recessed below the first surface of the substrate of the printed circuit board and at least partially exposed,
external terminals disposed on the second surface of the substrate of the printed circuit board, and
interconnections extending within the printed circuit board, the interconnections electrically connecting the internal terminals to the external terminals;
a main body disposed on the first surface of the substrate of the printed circuit board, the main body having an opening extending to that portion of the first surface below which the internal terminals of the printed circuit board are disposed, wherein the opening constitutes a cavity revealing the internal terminals; and
a semiconductor package disposed in the cavity, the semiconductor package including:
a substrate having a first surface and a second surface opposite the first surface,
a plurality of bond fingers in the first surface of the substrate,
a plurality of stacked memory chips,
bonding wires electrically connecting each of the memory chips to at least one of the plurality of bond fingers,
a controller chip electrically connected to at least one of the plurality of bond fingers, and
I/O terminals disposed on the second surface of the substrate and electrically connected to the bond fingers, wherein the I/O terminals of the semiconductor package are respectively electrically connected to the internal terminals of the printed circuit board.

18. The semiconductor card package of claim 17, wherein the I/O terminals of the semiconductor package solder the semiconductor package to the internal terminals of the printed circuit board.

19. The semiconductor package of claim 17, wherein the cavity of the main body corresponds in size to the semiconductor package.

20. The semiconductor card package of claim 17, wherein cavity of the main body corresponds in size to a plurality of semiconductor packages.

21. The semiconductor card package of claim 17, wherein the main body has at least two spaced apart openings constituting at least two cavities in the semiconductor card package, respectively, and wherein each cavity corresponds in size to the semiconductor package.

* * * * *